(12) United States Patent
Yu (10) Patent No.: US 11,603,600 B2
(45) Date of Patent: Mar. 14, 2023

(54) METHOD OF MANUFACTURING METAL MASK

(71) Applicant: Darwin Precisions Corporation, Hsinchu County (TW)

(72) Inventor: Jyun-Yi Yu, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 220 days.

(21) Appl. No.: 17/191,750

(22) Filed: Mar. 4, 2021

(65) Prior Publication Data

US 2022/0178039 A1    Jun. 9, 2022

(30) Foreign Application Priority Data

Dec. 7, 2020 (TW) ................. 109143109

(51) Int. Cl.

| | | |
|---|---|---|
| C25D 1/10 | (2006.01) | |
| C25D 1/20 | (2006.01) | |
| C23C 14/04 | (2006.01) | |
| G03F 7/20 | (2006.01) | |
| H01L 51/00 | (2006.01) | |
| H01L 51/56 | (2006.01) | |

(52) U.S. Cl.
CPC .............. *C25D 1/10* (2013.01); *C23C 14/042* (2013.01); *C25D 1/20* (2013.01); *G03F 7/20* (2013.01); *H01L 51/001* (2013.01); *H01L 51/0011* (2013.01); *H01L 51/56* (2013.01)

(58) Field of Classification Search
None
See application file for complete search history.

(56) References Cited

U.S. PATENT DOCUMENTS

| 2,166,366 A | 7/1939 | Norris ..................... H01J 19/00 430/323 |
| 2,166,367 A | 7/1939 | Norris ..................... C25D 1/08 216/36 |
| 2,226,384 A | 12/1940 | Norris ..................... C25D 1/08 29/896.6 |

(Continued)

FOREIGN PATENT DOCUMENTS

| CN | 1935515 A | 3/2007 |
| CN | 103205784 A | 7/2013 |

(Continued)

*Primary Examiner* — Louis J Rufo
(74) *Attorney, Agent, or Firm* — WPAT, PC (57) ABSTRACT

A method of manufacturing a metal mask includes providing a growth substrate with a conductive surface. Then, a cover pattern is formed on the conductive surface, which has at least one opening and an insulated surface touching the conductive surface. Next, using the cover pattern as a mask, a first electroforming is performed to form a mold part on the conductive surface. The mold part fills the opening and has a conductive pattern surface touching the conductive surface. The conductive pattern surface is flush with the insulated surface. After the first electroforming, the growth substrate is removed, while the cover pattern and the mold part are reserved. After removing the growth substrate, a second electroforming is performed to the conductive pattern surface of the mold part to form a metal pattern. Afterwards, the mold part and the cover pattern are removed from the metal pattern.

15 Claims, 6 Drawing Sheets

(56) References Cited

U.S. PATENT DOCUMENTS

| | | | |
|---|---|---|---|
| 2,246,380 A | 6/1941 | Norris | C25D 1/08 55/DIG. 24 |
| 2002/0164534 A1 | 11/2002 | Ogawa | C25D 1/08 430/323 |
| 2018/0277799 A1 | 9/2018 | Ikenaga | C25D 1/08 |
| 2019/0252614 A1 | 8/2019 | Jang | H01L 51/001 |
| 2020/0208250 A1 | 7/2020 | Kim | |

FOREIGN PATENT DOCUMENTS

| | | |
|---|---|---|
| CN | 109898104 A | 6/2019 |
| CN | 111378923 A | 7/2020 |
| JP | 2005206881 A | 8/2005 |
| TW | 201833389 A | 9/2018 |

METHOD OF MANUFACTURING METAL MASK

CROSS-REFERENCE TO RELATED APPLICATION

This application claims priority to Taiwan Application Serial Number 109143109, filed Dec. 7, 2020, which is herein incorporated by reference in its entirety.

BACKGROUND

Technical Field

The present disclosure relates to a method of manufacturing a metal mask. More particularly, the present disclosure relates to a method of manufacturing a metal mask by using electroforming.

Description of Related Art

Some of the existing display panels are made by using a Fine Metal Mask (FMM). Taking an Organic Light Emitting Diode (OLED) display panel for example, some of the OLED display panels are made by evaporation nowadays. In the process of the evaporation, the FMM is disposed on a glass plate at first and closely adjacent to the glass plate, so that the vapor plumes produced by evaporation can be deposited on the glass plate where an opening pattern of the FMM exposes according to the opening pattern.

The existing FMM has an upper surface, a lower surface opposite the upper surface, and a plurality of openings extending from the upper surface to the lower surface, wherein the openings for an opening pattern. The sidewall of each opening is usually substantially perpendicular to both the upper surface and the lower surface. Hence, during the evaporation, the vapor plumes from the evaporation source can move to the glass plate along the normal line, thereby causing the deposition on the glass plate where the opening pattern exposes.

However, since the sidewall of each opening is usually substantial perpendicular to both the upper surface and the lower surface, the vapor plumes moving to the glass plate without being along the normal line of the glass plate mostly are blocked by the part of the FMM around each of the openings, so that the deposits are difficult to completely cover the areas of the glass plate which the opening pattern exposes, resulting in problems that cause the pixels of the OLED display panel to lack color or to distort color, thereby reducing the yield.

SUMMARY

At least one embodiment of the disclosure provides a method of manufacturing a metal mask having a convex surface.

A method of manufacturing a metal mask according to at least one embodiment of the disclosure includes providing a growth substrate, in which the growth substrate has a conductive surface with a normal line. A cover pattern is formed on the conductive surface, in which the cover pattern is an electric insulator and has at least one opening and an insulated surface in contact with the conductive surface. The opening extends from the insulated surface along the normal line. Next, using the cover pattern as a mask, a first electroforming is performed, so as to form a mold part on the conductive surface, in which the mold part fills the opening and has a conductive pattern surface in contact with the conductive surface, while the conductive pattern surface is flush with the insulated surface. After performing the first electroforming, the growth substrate is removed, and both the cover pattern and the mold part are reserved. After the growth substrate is removed, a second electroforming is performed to the conductive pattern surface of the mold part, so as to form a metal pattern on the conductive pattern surface. After performing the second electroforming, both the mold part and the cover pattern are removed from the metal pattern.

Based on the above, since the conductive pattern surface of the mold part is flush with the insulated surface of the cover pattern, and metal material cannot be deposited on the insulated surface during performing the second electroforming, the boundary between the conductive pattern surface and the insulated surface can cause the metal pattern (i.e., the metal mask) to form the convex surface and a plurality of hollow areas, where the width of the hollow area is non-uniform. Therefore, the vapor plumes can enter the hollow areas from the convex surface and be deposited successfully on a target object (e.g., glass plate) where the hollow areas expose, so as to help to reduce or to prevent the problems of lack of colors in the pixels or color distortion of the pixels, thereby improving the yield.

These and other features, aspects, and advantages of the present disclosure will become better understood with reference to the following description and appended claims.

It is to be understood that both the foregoing general description and the following detailed description are examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Secondly, the words "about", "approximately", or "substantially" appearing in the content of the present disclosure not only cover the clearly stated values and range of values, but also include those with ordinary knowledge in the technical field to which the disclosure belongs. The allowable deviation range, which can be determined by the error generated during the measurement, and the error is caused by the limitation of the measurement system or the process conditions, for example. In addition, "about" may be expressed within one or more standard deviations of the above values, such as within ±30%, ±20%, ±10%, or ±5%. The words "about", "approximately" or "substantially" appearing in this text can choose acceptable deviation range or standard deviation according to optical properties, etching properties, mechanical properties or other properties, not just one Standard deviation to apply all the above optical properties, etching properties, mechanical properties and other properties.

Figure 1A:
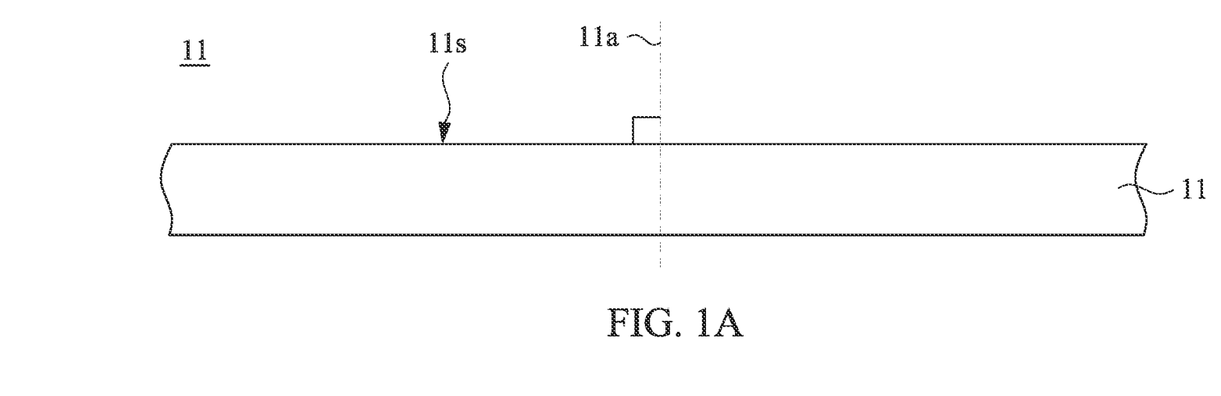
FIGS. 1A to 1G are schematic cross-sectional views of a method of manufacturing a metal mask according to at least one embodiment of the disclosure.

FIGS. 1A to 1G are schematic cross-sectional views of a method of manufacturing a metal mask according to at least one embodiment of the disclosure. Referring to FIG. 1A, in the embodiment of the method of manufacturing a metal mask, first, a growth substrate 11 is provided, in which the growth substrate 11 may be a conductive plate, which can be a metal plate, such as stainless steel plate. Alternatively, the growth substrate 11 also may be a conductive non-metallic plate, which can be a board made of carbon, such as graphite sheet or graphite board. Moreover, the growth substrate 11 also may be a compound board or a compound sheet and include at least one conductive layer. For example, the growth substrate 11 may be a glass plate coated with at least one transparent conductive layer, in which the transparent conductive layer can be made of Indium Tin Oxide (ITO) or Indium Zinc Oxide (IZO).

The growth substrate 11 has a conductive surface 11s, which has a normal line 11a. When the growth substrate 11 is the metal plate or the conductive non-metallic plate (e.g., graphite sheet or graphite board), the conductive surface 11s can be one of the surfaces of the growth substrate 11, for example, the upper surface (as shown in FIG. 1A) or the lower surface. When the growth substrate 11 is the compound board or the compound sheet, the conductive surface 11s is the outer surface of the outermost conductive layer. For example, the growth substrate 11 is a glass plate coated with a transparent conductive layer, and the conductive surface 11s is the outer surface of the transparent conductive layer.

Figure 1B:
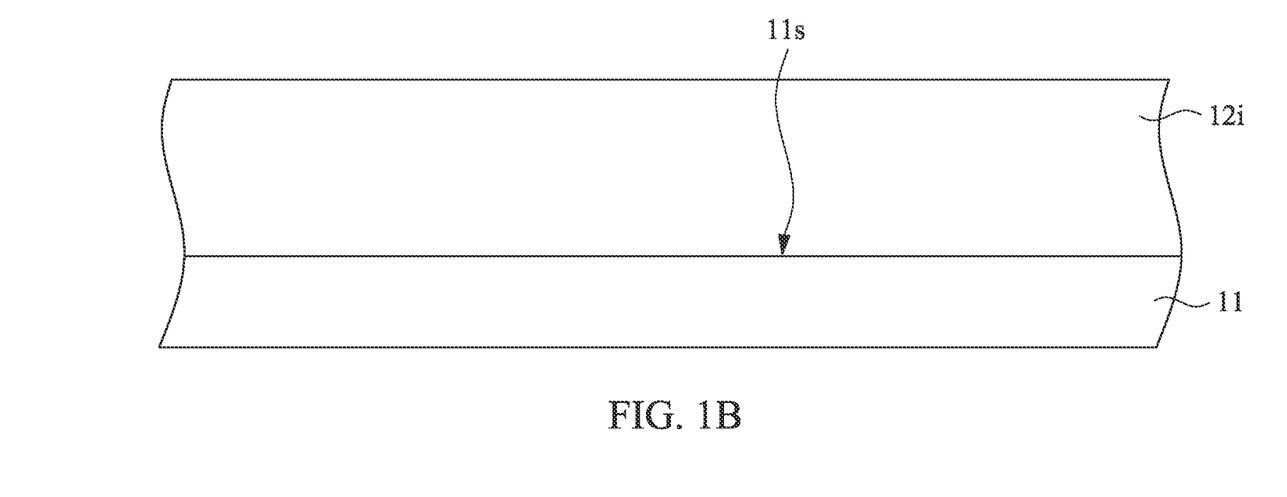
Figure 1C:
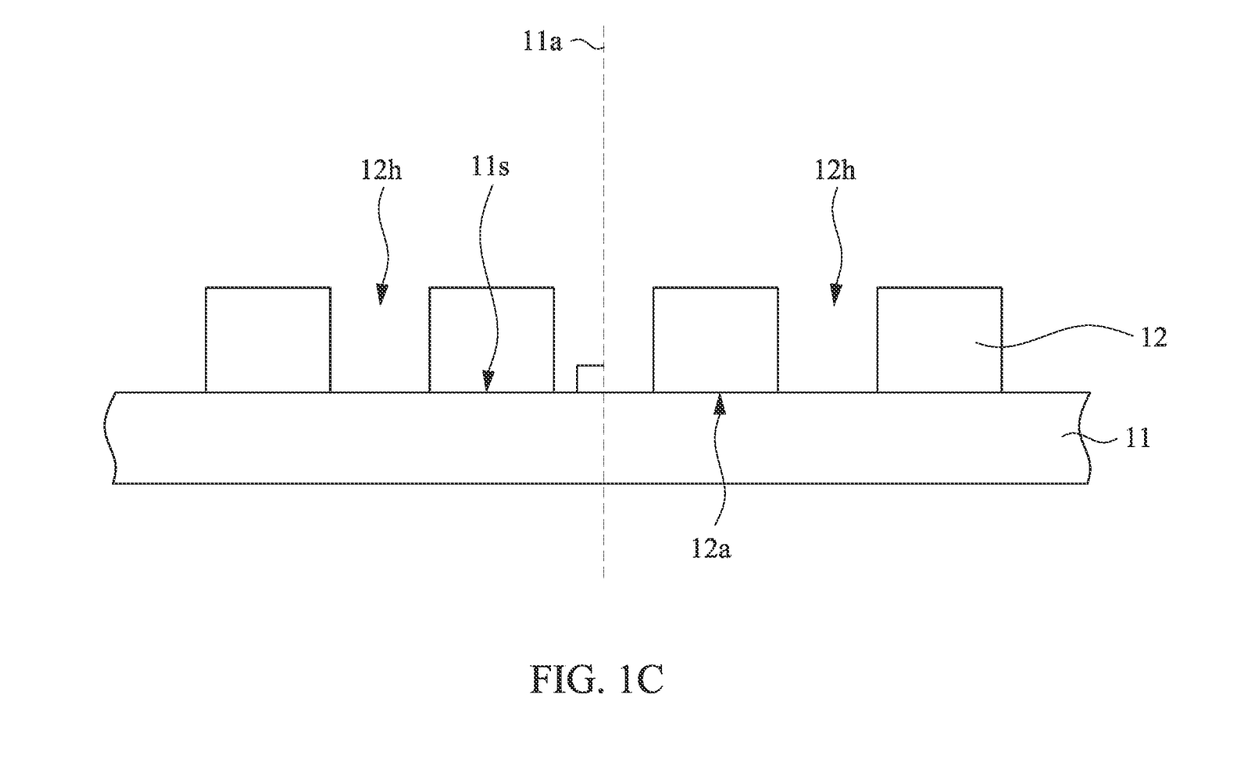

Referring to FIGS. 1B and 1C, next, a cover pattern 12 is formed on the conductive surface 11s, where forming the cover pattern 12 can include exposure and development, and the cover pattern 12 may be a photoresist pattern after exposure and development. Specifically, referring to FIG. 1B, in the formation of the coverage pattern 12, first, a photoresist 12i is formed on the conductive surface 11s of the growth substrate 11, where the photoresist 12i is an electric insulator, and the photoresist 12i can be formed on the conductive surface 11s by coating, such as spin coating or spray coating.

Referring to FIGS. 1B and 1O, next, the exposure and the development are performed in sequence to the photoresist 12i, so as to remove the part of the photoresist 12i, thereby forming the cover pattern 12 having at least one opening 12h on the conductive surface 11s, as shown in FIG. 1O. The cover pattern 12 which is an electric insulator further has an insulated surface 12a in contact with the conductive surface 11s, where the opening 12h extends from the insulated surface 12a along the normal line 11a. In addition, in the embodiment as shown in FIG. 10, the cover pattern 12 has a plurality of openings 12h, where the openings 12h may be arranged in an array. However, in other embodiment, the cover pattern 12 can have only one opening 12h, so that FIG. 10 does not limit the quantity of the openings 12h which the cover pattern 12 has.

Figure 1D:
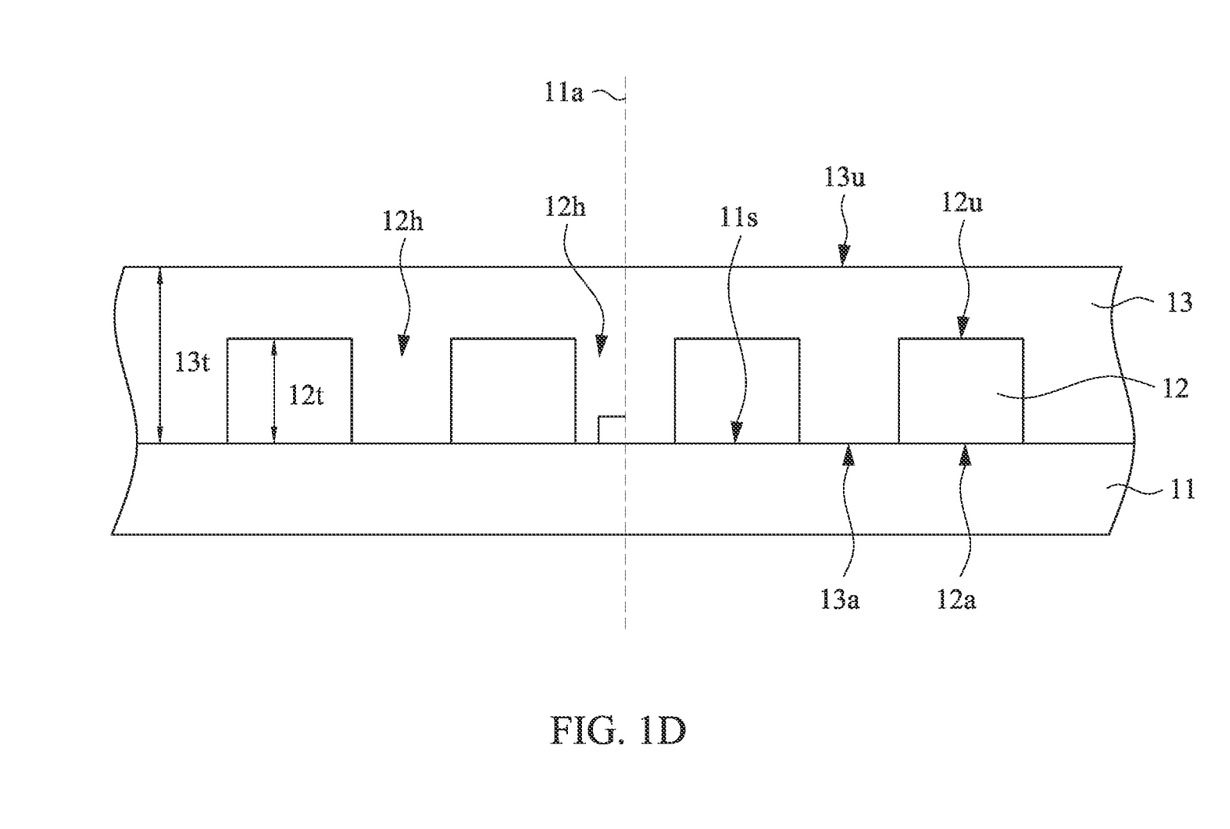

Referring to FIG. 1D, after forming the cover pattern 12, the first electroforming is performed by using the cover pattern 12 as a mask, so as to form a mold part 13 on the conductive surface 11s. Thus, the mold part 13 can be made by electroforming (i.e., first electroforming) and made of the metal material deposited on the conductive surface 11s. The metal material is deposited in the openings 12h, so that the mold part 13 fills the openings 12h and has a conductive pattern surface 13a in contact with the conductive surface 11s. Moreover, the metal material of the mold part 13 may be nickel, and the material of the mold part 13 can be different from that of the growth substrate 11, where the material of the growth substrate 11 may be stainless steel, for example.

The thickness 13t of the mold part 13 can be larger than or equal to the depth 12t of the opening 12h, in which the depth 12t of the opening 12h corresponds to the thickness of the cover pattern 12. Hence, the mold part 13 has an upper surface 13u opposite to the conductive pattern surface 13a, and the cover pattern 12 can be located between the upper surface 13u and the growth substrate 11, as shown in FIG. 1D. Alternatively, when the thickness 13t is equal to the depth 12t, the upper surface 13u of the mold part 13 can be flush with the upper surface 12u of the cover pattern 12, in which the upper surface 12u is opposite to the insulated surface 12a.

Figure 1E:
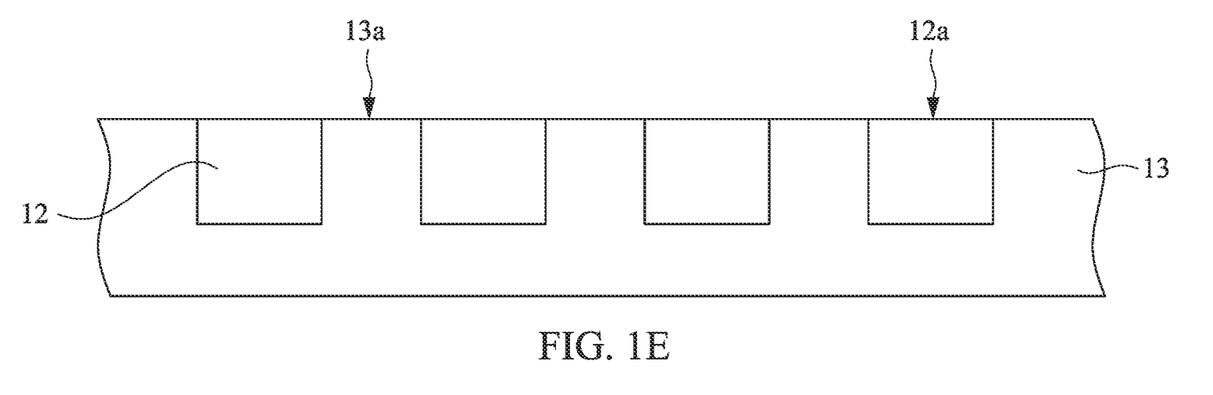

Referring to FIGS. 1D and 1E, after performing the first electroforming, the growth substrate 11 is removed, and both the cover pattern 12 and the mold part 13 are reserved, where both the cover pattern 12 and the mold part 13 shown in FIG. 1E are drawn based on inverted FIG. 1D. There are a plurality of ways to remove the growth substrate 11. For example, the removal of the growth substrate 11 can be peeling. Specifically, a worker can use his hands to peel off the growth substrate 11 directly, so as to remove the growth substrate 11.

In addition to peeling, since the material of the mold part 13 (e.g., nickel) can be different from the material of the growth substrate 11 (e.g., stainless steel), the removal of the growth substrate 11 also can be etching. Thus, the removal of the growth substrate 11 is not limited to peeling. After the growth substrate 11 is removed, both the conductive pattern surface 13a and the insulated surface 12a are exposed. Both the conductive pattern surface 13a and the insulated surface 12a, which are originally in contact with the same conductive surface 11s, are flush with each other, as shown in FIG. 1E.

Figure 1F:
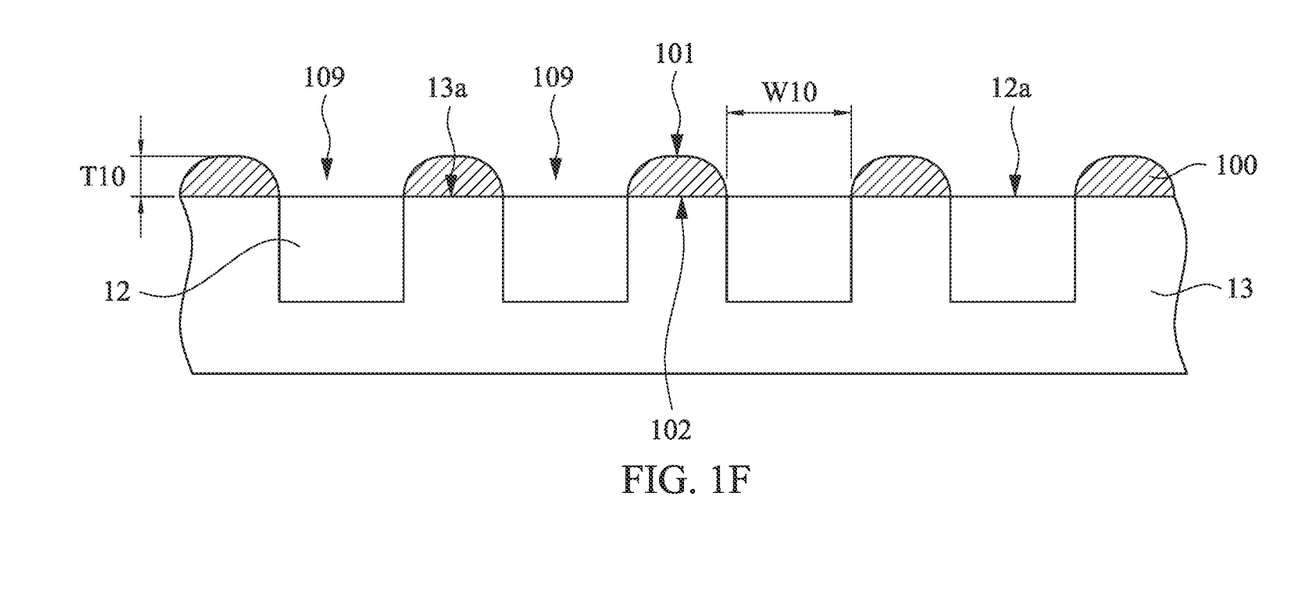

Referring to FIG. 1F, after removing the growth substrate 11, both the conductive pattern surface 13a of the mold part 13 and the insulated surface 12a of the cover pattern 12 are exposed, so that the exposed conductive pattern surface 13a and the insulated surface 12a can touch the electroplating solution, thereby performing a second electroforming to the conductive pattern surface 13a, so as to form a metal pattern 100 on the conductive pattern surface 13a, where the metal pattern 100 is substantially a metal mask.

The metal pattern 100 has a plurality of hollow areas 109, and hollow areas 109 are the openings of the metal pattern 100 (i.e., the metal mask), in which the minimum width W10 of at least one hollow area 109 can range between 10 µm and 50 µm. In the embodiment of FIG. 1F, the minimum width W10 of each of the hollow areas 109 can range between 10 µm and 50 µm, but in other embodiment, the minimum width W10 of at least one hollow area 109 can be out of the above range, so that the minimum width W10 is not limited to the above range. In addition, both materials of the mold part 13 and the metal pattern 100 are different. For example, the material of the mold part 13 can be nickel, whereas the material of the metal pattern 100 can be single metal or alloy, such as nickel-iron alloy.

When the material of the metal pattern 100 (i.e., metal mask) is nickel-iron alloy, the iron content of the metal pattern 100 can range between 50% and 65%, whereas the nickel content of the metal pattern 100 can range between 35% and 50%. Hence, the contents of the metal pattern 100 can basically contain iron and nickel, such as 65% iron and 35% nickel. In addition, the thickness T10 of the metal pattern 100 can range between 5 µm and 25 µm.

In the process of performing the second electroforming, both the conductive pattern surface 13a and the insulated surface 12a which are exposed can touch the electroplating solution, so that the metal material can be deposited on the conductive pattern surface 13a, but not deposited on the insulated surface 12a. Since the conductive pattern surface 13a is flush with the insulated surface 12a, and the metal material are not deposited on the insulated surface 12a, the boundary between the conductive pattern surface 13a and the insulated surface 12a can cause the metal pattern 100 to form the convex surface 101, so that the width of the hollow area 109 is non-uniform, as shown in FIG. 1F.

Figure 1G:
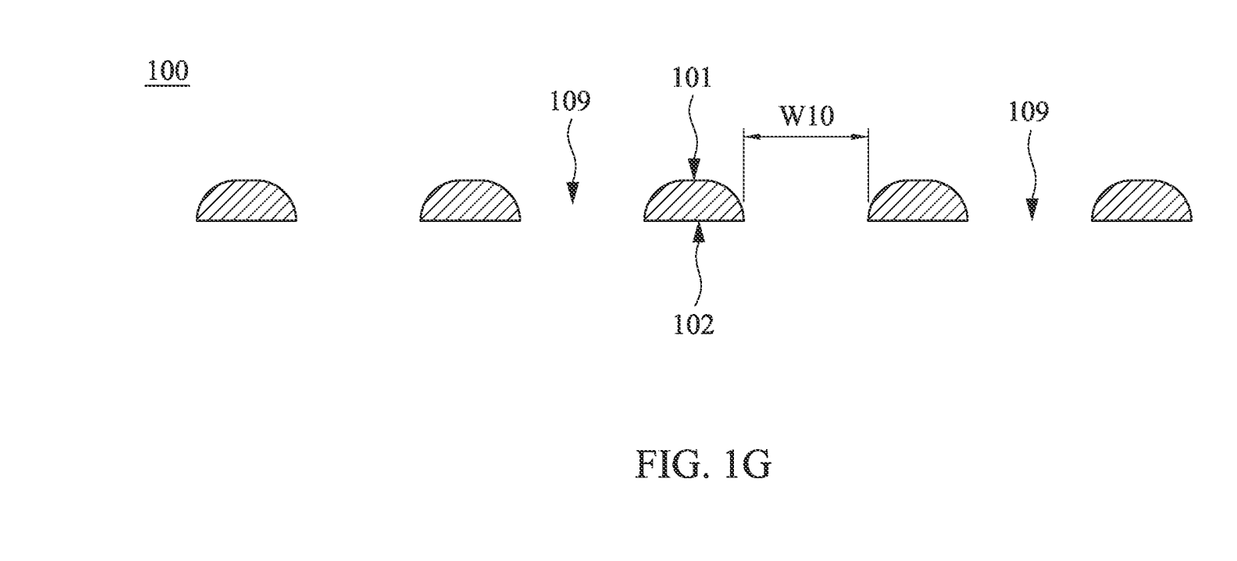

Referring to FIGS. 1F and 1G, after performing the second electroforming, both the mold part 13 and the cover pattern 12 are removed from the metal pattern 100, in which the removal of both the mold part 13 and the cover pattern 12 can be peeling. For example, a worker can use his hands to peel the metal pattern 100 from the mold part 13 to separate the metal pattern 100 and the mold part 13, thereby removing the cover pattern 12 and the mold part 13. At this time, a metal mask (i.e., metal pattern 100) is basically complete, in which the metal mask has the convex surface 101 and a bottom surface 102 opposite to the convex surface 101.

Figure 2:
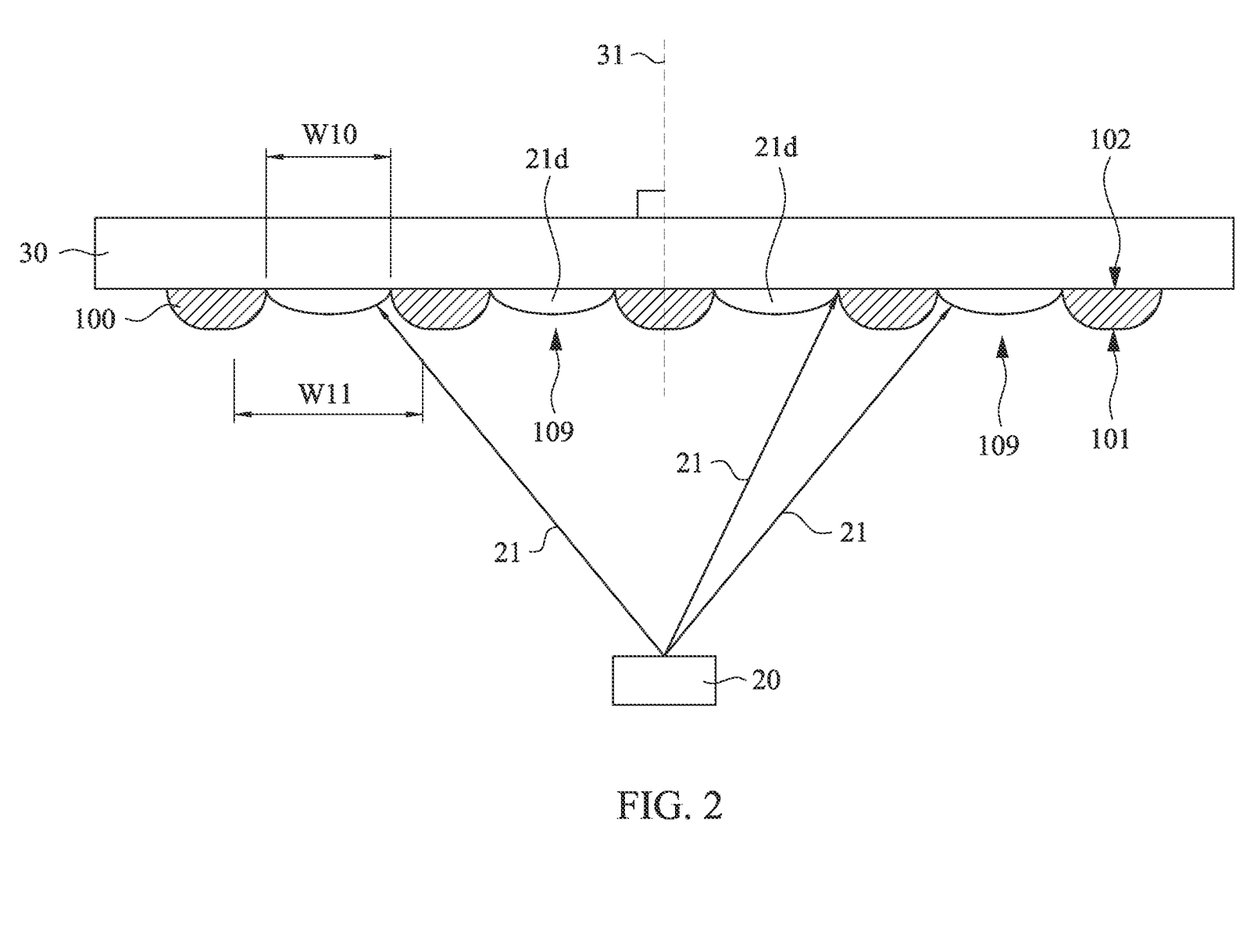
FIG. 2 is a schematic cross-sectional view of the metal mask in FIG. 1G used in evaporation.

FIG. 2 is a schematic cross-sectional view of the metal mask in FIG. 1G used in evaporation, in which FIG. 2 and the following description still use the metal pattern 100 for representing the metal mask. Referring to FIG. 2, since the metal pattern 100 has the convex surface 101, the width of the hollow area 109 is non-uniform, in which each of the hollow areas 109 has a maximum width W11 at the top of the convex surface 101, whereas the bottom surface 102 has the minimum width W10. In the process of evaporation, the metal pattern 100 is closely adjacent to a target object 30, where the target object 30 can be a glass plate, but is not limited to the glass plate.

The convex surface 101 faces the evaporation source 20, whereas the bottom surface 102 faces the target object 30. The top of the convex surface 101 has the maximum width W11, but the bottom surface 102 has the minimum width W10. Accordingly, whether the vapor plumes 21 from the evaporation source 20 move along or not along the normal line 31 of the target object 30, the vapor plumes 21 can enter the hollow areas 109 from the convex surface 101 and be deposited successfully on the target object 30 where the hollow areas 109 expose, thereby forming a plurality of deposits 21d. In addition, the deposits 21d can be used as a plurality of light-emitting layers inside an OLED display panel.

Compared with the existing FMM, the metal pattern 100 (i.e., metal mask) according to at least one embodiment of the disclosure can help the vapor plumes 21 moving to the target object 30 not along the normal line 31 to be deposited successfully on the areas of the target object 30 which the hollow areas 109 expose, so as to reduce or to prevent the problems of lack of colors in the pixels or color distortion of the pixels, thereby improving the yield.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing metal mask, comprising:
   providing a growth substrate, wherein the growth substrate has a conductive surface, and the conductive surface has a normal line;
   forming a cover pattern on the conductive surface, wherein the cover pattern is an electric insulator, and the cover pattern has at least one opening and an insulated surface in contact with the conductive surface, the at least one opening extending along the normal line from the insulated surface;
   using the cover pattern as a mask, performing a first electroforming, so as to form a mold part on the conductive surface, wherein the mold part fills the at least one opening and has a conductive pattern surface in contact with the conductive surface, wherein the conductive pattern surface is flush with the insulated surface;
   after performing the first electroforming, removing the growth substrate, and reserving the cover pattern and the mold part;
   after removing the growth substrate, performing a second electroforming to the conductive pattern surface of the mold part, so as to form a metal pattern on the conductive pattern surface; and
   after performing the second electroforming, removing the mold part and the cover pattern from the metal pattern.

2. The method of claim 1, wherein forming the cover pattern comprises exposure and development.

3. The method of claim 1, wherein a thickness of the mold part is larger than or equal to a depth of the opening.

4. The method of claim 1, wherein a material of the mold part is different from a material of the metal pattern.

5. The method of claim 1, wherein the metal pattern has a plurality of hollow areas, and the at least one of the hollow areas has a minimum width ranging between 10 µm and 50 µm.

6. The method of claim 1, wherein a thickness of the metal pattern ranges between 5 µm and 25 µm.

7. The method of claim 1, wherein a material of the metal pattern is nickel-iron alloy, and an iron content of the metal pattern ranges between 50% and 65%.

8. The method of claim 7, wherein a nickel content of the metal pattern ranges between 35% and 50%.

9. A method of manufacturing metal mask, comprising:
providing a growth substrate, wherein the growth substrate has a conductive surface, and the conductive surface has a normal line;
forming a cover pattern on the conductive surface, wherein the cover pattern is an electric insulator, and the cover pattern has at least one opening and an insulated surface in contact with the conductive surface, the at least one opening extending along the normal line from the insulated surface;
using the cover pattern as a mask, performing a first electroforming, so as to form a mold part on the conductive surface, wherein the mold part fills the at least one opening and has a conductive pattern surface in contact with the conductive surface, wherein the conductive pattern surface is flush with the insulated surface, and a thickness of the mold part is larger than or equal to a depth of the opening;
after performing the first electroforming, removing the growth substrate, and reserving the cover pattern and the mold part;
after removing the growth substrate, performing a second electroforming to the conductive pattern surface of the mold part, so as to form a metal pattern on the conductive pattern surface, wherein a material of the mold part is different from a material of the metal pattern; and
after performing the second electroforming, removing the mold part and the cover pattern from the metal pattern.

10. The method of claim 9, wherein forming the cover pattern comprises exposure and development.

11. The method of claim 9, wherein the metal pattern has a plurality of hollow areas, and the at least one of the hollow area has a minimum width ranging between 10 μm and 50 μm.

12. The method of claim 9, wherein a thickness of the metal pattern ranges between 5 μm and 25 μm.

13. The method of claim 9, wherein the metal pattern has a plurality of hollow areas, a thickness of the metal pattern ranges between 5 μm and 25 μm, and the at least one of the hollow areas has a minimum width ranging between 10 μm and 50 μm.

14. The method of claim 9, wherein a material of the metal pattern is nickel-iron alloy, and an iron content of the metal pattern ranges between 50% and 65%.

15. The method of claim 14, wherein a nickel content of the metal pattern ranges between 35% and 50%.

* * * * *